US006433589B1

(12) United States Patent
Lee

(10) Patent No.: US 6,433,589 B1
(45) Date of Patent: Aug. 13, 2002

(54) SENSE AMPLIFIER AND METHOD FOR SENSING SIGNALS IN A SILICON-ON-INSULATOR INTEGRATED CIRCUIT

(75) Inventor: Michael Ju Hyeok Lee, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/833,428

(22) Filed: Apr. 12, 2001

(51) Int. Cl.[7] ............................................. H03K 19/064
(52) U.S. Cl. .................... 326/115; 326/95; 326/112; 326/119
(58) Field of Search ............................. 326/95, 98, 112, 326/115, 119, 121

(56) References Cited

U.S. PATENT DOCUMENTS 5,986,924 A * 11/1999 Yamada .................... 365/154
6,037,808 A   3/2000 Houston et al.
6,061,267 A * 5/2000 Houston .................... 365/154
6,177,811 B1 * 1/2002 Fuse et al. .................. 326/119

OTHER PUBLICATIONS

U. S. patent application Ser. No. 09/316,753.
U. S. patent application Ser. No. 09/345,720.

* cited by examiner

Primary Examiner—Michael Tokar
Assistant Examiner—Anh Tran
(74) Attorney, Agent, or Firm—Casimer Salys; Weiss & Moy, P.C.; Andrew M. Harris

(57) ABSTRACT

An improved sense amplifier ad method for sensing signals in a silicon-on-insulator (SOI) integrated circuit improve the performance of semiconductor memories and other circuits implemented in SOI technology. The bodies of amplifier transistors within the sense amplifier and bodies of input transistors to the sense amplifier are coupled to corresponding input signals, eliminating the history dependance that would result from unconnected bodies, while achieving faster switching times due to a dynamically produced difference in threshold voltage of the input transistors and amplifier transistors. The switching time is improved over circuits using input transistors and amplifier transistors having statically biased bodies.

14 Claims, 2 Drawing Sheets

SENSE AMPLIFIER AND METHOD FOR SENSING SIGNALS IN A SILICON-ON-INSULATOR INTEGRATED CIRCUIT

CROSS-REFERENCE TO RELATED APPLICATIONS

The present invention is related to U.S. patent application Ser. No. 09/316,753 entitled "METHOD AND APPARATUS FOR FAST SOI BASED AMPLIFIER" filed May 21, 1999 having at least one common inventor and assigned to the same assignee, the specification of which is incorporated herein by reference. The present invention is also related to U.S. patent application Ser. No. 09/345,720 entitled "A SILICON-ON-INSULATOR(SOI) DYNAMIC SENSE AMPLIFIER" filed Jun. 30, 1999 and assigned to the same assignee.

BACKGROUND OF THE INVENTION

1. Technical Field

The present invention relates to digital integrated circuits, and more particularly to dynamic logic circuits implemented in Silicon-On-Insulator (SOI) technology wherein differential signals are detected.

2. Description of the Related Art

Dynamic logic circuits are frequently used in integrated circuits, particularly in very large scale integrated circuits (VLSI). Dynamic logic circuits are widely used in semiconductor memories, microprocessors and large logic arrays. Recently, Silicon-On-Insulator (SOI) technology has been used to implement dynamic circuits within semiconductor memories and microprocessors. SOI integrated circuits provide shorter delays and lower power dissipation due to reduced substrate capacitance. SOI channel material is formed within a "trench" above an oxide insulating layer, reducing resistive leakage to the substrate and capacitive loading by the substrate. The "body" of an SOI transistor is the channel material to which the source and drain complementary material is added. For an N-channel transistor, the body is generally P type material and the source and drain are both formed from N+ type material. The body is electrically isolated, in contrast to non-insulated technologies that form the channel material on a conducting substrate. In non-insulated technologies, the substrate is biased to a power supply rail, raising the capacitive loading on the transistor terminals and thus reducing the switching speed of the transistors formed in non-insulated technologies.

Sense amplifiers are used within dynamic logic circuits and most particularly within memory circuits to detect differential signals provided by "bitlines". The bitlines are the outputs of the storage array and the access delay of the memory may be limited by the capacitance of the bitline. Thus, the speed of a memory of a given size is dependent on the speed at which the voltage differential present on the bitlines can be reliably detected. This speed limitation is also dependent on the power supply voltage within the storage array, since for reduced power supply voltage, the voltage differential is proportionately reduced at time of measurement.

Sense amplifiers implemented in SOI circuit designs use a cross-coupled amplifier structure to provide a bistable circuit having differential inputs and outputs. A differential input transistor pair is used to detect a voltage difference during an evaluation period in which the differential state of the input signals is determined, producing the correct state of the sense amplifier outputs. In SOI technology, the "body" of the transistors is insulated from the substrate, and therefore is not implicitly biased as in typical metal-oxide semiconductor (MOS) technology. If the body of the input transistors is not biased, charge accumulating on the body can cause improper operation of a sense amplifier, since the accumulated charge affects the threshold voltage of the input transistors. The charge accumulation effect can cause "history dependence" (since the charge accumulation is a function of the previous switching history of the amplifier).

Typically, the bodies of the sense amplifier input transistors are biased to a fixed reference by coupling the bodies to ground for an N-channel ground-referenced input, or coupling the bodies to the power supply rail for a P-channel rail referenced input.(mention pending app) Biasing the input transistor bodies with a fixed reference is disadvantageous in that parasitic capacitance from the gate to the body loads the input signal with the full value of the gate to body capacitance, delaying switching of the sense amplifier input transistors and thus increasing sense amplifier evaluation time.

It would therefore be desirable to eliminate the history dependence of the input transistors in a SOI sense amplifier without biasing the bodies of the input transistors with a fixed reference.

SUMMARY OF THE INVENTION

The objective of eliminating the history dependance of the input transistors in an SOI sense amplifier is accomplished in an improved sense amplifier and method for sensing signals in a silicon-on-insulator integrated circuit. The improved sense amplifier is a dynamic logic circuit fabricated on a substrate including a sense amplifier with a latch transistor that has a body insulated from the substrate and an input transistor coupled to the latch transistor. The input transistor also has a body insulated from the substrate and the body of the input transistor and the body of the latch transistor are coupled to an input of the dynamic logic circuit. The threshold voltages of both the input transistor and the latch transistor are altered by the signal on the input of the dynamic logic circuit, yielding an improved switching speed.

The foregoing and other objectives, features, and advantages of the invention will be apparent from the following, more particular, description of the preferred embodiment of the invention, as illustrated in the accompanying drawings.

DETAILED DESCRIPTION OF PREFERRED EMBODIMENT

Figure 1:
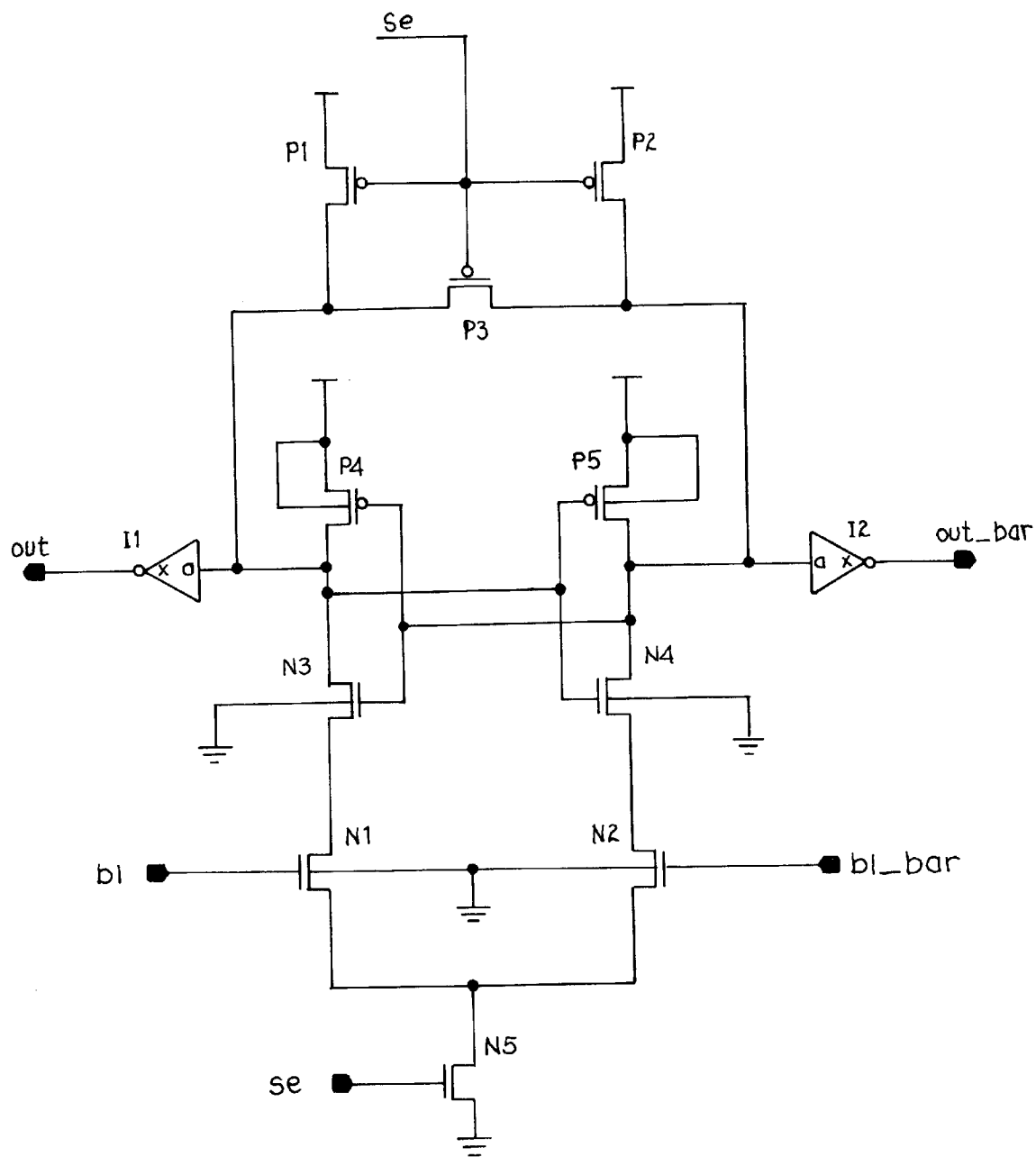
FIG. 1 is an electrical schematic of a sense amplifier.

Referring to FIG. 1, a dynamic logic circuit embodying a sense amplifier having a buffered input stage is depicted. Latch transistors N3 and N4 form a cross-coupled pair that provide complementary outputs to output inverters I1 and I2. Latch transistors P4 and P5 are of complementary type to latch transistors N3 and N4, providing a complementary cross-coupled stage that holds a state of the sense amplifier. In the circuits described in the above-incorporated patent application "METHOD AND APPARATUS FOR FAST SOI BASED AMPLIFIER", the inputs to the sense amplifier are applied directly to the inputs of the output inverters, requiring that inputs to the dynamic logic circuit be capable of driving the circuit loads associated with all of the components that are coupled to the input of an output inverter. In the circuit of FIG. 1 (as well as in the embodiments of the present invention), input transistors N1 and N2 are provided to isolate the input signals which are generally the outputs of a memory storage array (the bitlines), so that the input signals are not required to drive the inputs of output inverters I1 and I2 as well as the sense amplifier latch transistors N3, N4, P4 and P5.

Pre-charge transistors P1, P2 and P3 are coupled to sense enable input se. When se is in a logic low state (sense disabled), the inputs of output inverters I1 and I2 are pulled to a high logic state, presetting the circuit so that when sense enable input se is set to a high logic state (sense enabled), the state of the cross-coupled amplifier may be set.

Input transistors N1 and N2 are used to set the state of the cross-coupled amplifier. Inputs b1 and b1_bar are complementary signals, so that only one of transistors N1 or N2 will conduct. Transistor N5 is a foot device that prevents conduction through input transistors N1 and N2 before sensing is enabled. Input transistors N1 and N2 are fabricated in Silicon-On-Insulator (SOI) technology or other channel-insulated technology. When the channel is insulated from the substrate, the transistor has a "body" formed by the channel. The bodies of input transistors N1 and N2 are grounded, preventing charge accumulation on the bodies. If charge were allowed to accumulate on the bodies of input transistors N1 and N2, their threshold voltages would be a function of their prior states, a phenomenon known as "history dependence." Varying threshold voltage, and particularly history dependance of the threshold voltage may lead to erratic operation of circuits or reduced circuit performance. By biasing the bodies of input transistors N1 and N2, the history dependance is eliminated by permitting charge to flow to and from the body of input transistors N1 and N2, preventing charge accumulation.

Biasing the bodies of transistors to ground produces a degradation in performance. The body of the transistor has a capacitance to the gate of the transistor that will appear at the gate terminal as a capacitor to ground (rather than as an open circuit for an unconnected body). Additionally, if the body of an N-channel device is biased to the lowest potential in the circuit (in the illustrations—ground potential), the threshold voltage will be at its highest value, delaying switching time. The highest value for the threshold voltage is due to the field contribution of the body voltage to the channel of the transistor.

Latch transistors N3 and N4 also have bodies biased to ground to eliminate history dependence on their prior states. The above-incorporated patent application describes a technique for enhancing the switching speed by coupling the bodies of the latch transistors to inputs of the sense amplifier, improving the switching speed of the latch.

Biasing the body of silicon-on-insulator transistors eliminates the history dependence caused by a floating body. When the body of a transistor is left unconnected, the time required for the charge on the body to stabilize is on the order of milliseconds. The voltage on a floating body of a transistor that is dynamically switching signals on the order of nanoseconds will therefore be a time-average of more than a million cycles. Biasing the body of a silicon-on-insulator transistor affects the threshold voltage of the transistor. The field that controls conduction of the transistor is produced by the gate to source voltage of the transistor, but the field is affected by a body connection. If the body of an N-channel transistor is biased approximately to the source potential, the field produced by the gate voltage will be reduced, causing a higher threshold voltage. If the body of an N-channel transistor is coupled approximately. to the gate potential for the "on" condition, the field will be enhanced, causing a lower threshold voltage.

Figure 2:
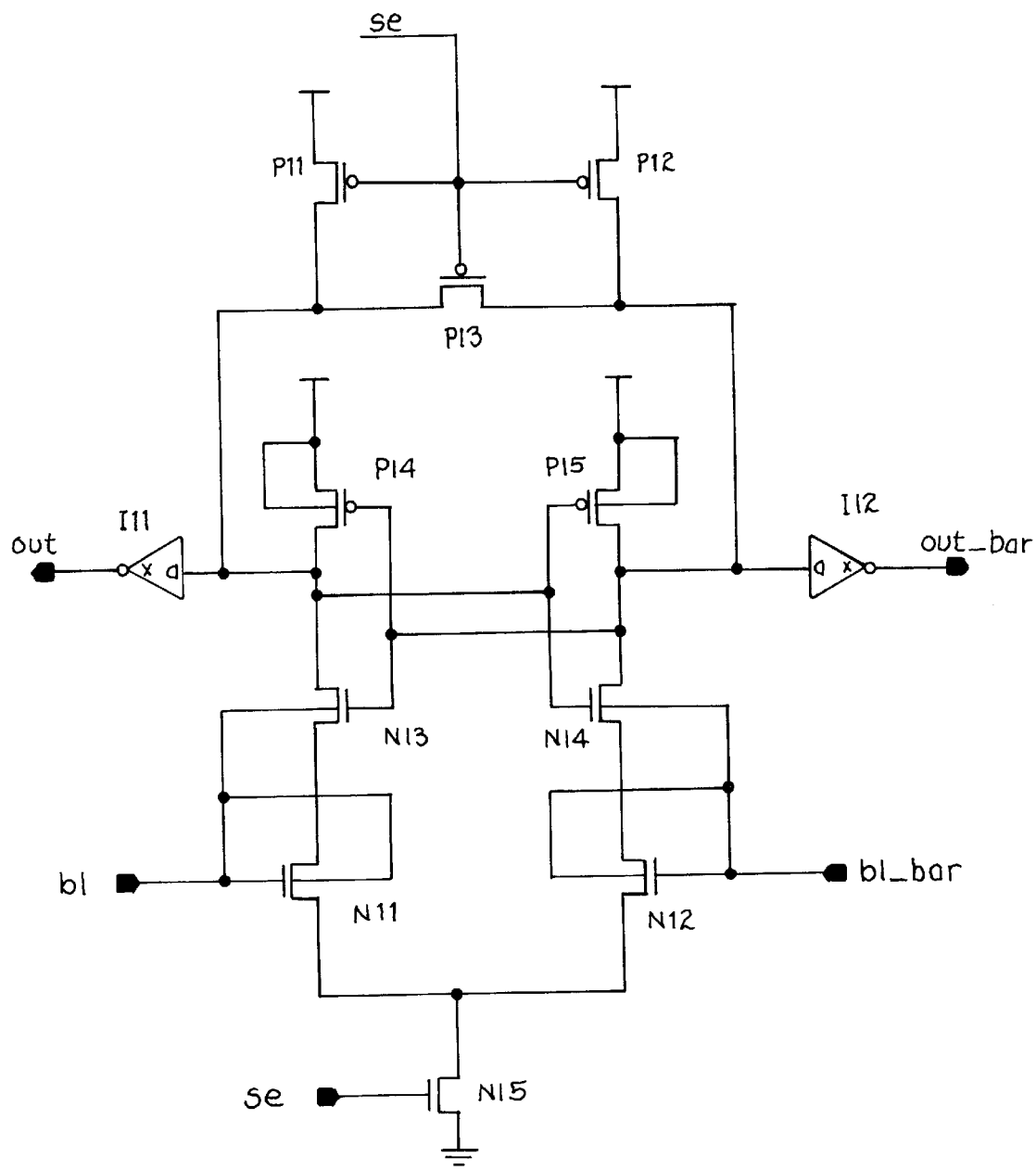
FIG. 2 is an electrical schematic of a sense amplifier in accordance with a preferred embodiment of the invention.

Referring now to FIG. 2, an improved sense amplifier having buffered inputs is depicted in accordance with a preferred embodiment of the invention. Input transistors N11 and N12 have bodies coupled to their respective gates, which receive the input signals from an external circuit such as memory array bitlines. The input signals are valid before sense enable input se is asserted and the inputs are complementary inputs. Therefore, one of input transistors N11 or N12 will have a logic low signal imposed on its gate. For example, if b1 is in a logic high state, input b1_bar will fall to a logic low state when bitline value stabilizes. As b1_bar falls to a low level, both the body voltage and the gate voltage of input transistor N12 are lowered, simultaneously raising the threshold voltage and turning off the gate of input transistor N12. In this design, the raised threshold voltage of input transistor N12 improves the operation of the sense amplifier, as the threshold voltage is raised for a transistor that is being turned off, decreasing the turn-off time.

Input transistor N11 has a body coupled to input signal b1, which in this example is held in a logic high state. As described above, raising the body of input transistor N11 to a logic high state (high voltage) lowers the threshold voltage of input transistor N11, decreasing the turn-on time of input transistor N11. Thus, both inputs of the sense amplifier will have decreased switching time according to the switching direction. The input transistor turning off will turn off faster while the input transistor turning on will turn on faster. The action of the input signals on the bodies of input transistors N11 and N12 provide greater tolerance for the setup time of the input signals and reduce the voltage swing requirements of the input signals, permitting fabrication of lower voltage memories or memories with shorter access times.

In addition to the body biasing of input transistors N11 and N12, the bodies of latch transistors N13 and N14 are similarly biased, providing an improved switching speed within the sense amplifier and further improving memory circuit performance. In the example given above, when b1_bar falls to a low level, the body voltage of latch transistor N14 is lowered while input transistor N12 is turned off, causing latch transistor N14 to turn off faster than it would if charge had accumulated on its body, raising its threshold voltage. Similarly, the body of latch transistor N13 is held at a logic high level by input signal b1, which lowers the threshold voltage of latch transistor N13 thus speeding the turn-on of latch transistor N13.

Pre-charge transistors P11, P12 and P13 are coupled to sense enable input se. When se is in a logic low state (sense disabled), the inputs of output inverters I11 and I12 are pulled to a high logic state, presetting the circuit so that when sense enable input se is set to a high logic state (sense enabled), the state of the cross-coupled amplifier may be set. Foot device N15 isolates the input transistors while sense enable input se is in a logic low state, as described above for the circuit of FIG. 1.

While the invention has been particularly shown and described with reference to the preferred embodiment thereof, it will be understood by those skilled in the art that the foregoing and other changes in form, and details may be made therein without departing from the spirit and scope of the invention.

What is claimed is:

1. A dynamic logic circuit fabricated on a substrate, said dynamic logic circuit comprising:
 a sense amplifier including a first latch transistor having a body insulated from said substrate, and a second latch transistor having a first channel connection coupled to a gate of said first latch transistor and a gate coupled to a second channel connection of said first latch transistor, whereby said first latch transistor and second latch transistor form a cross-coupled pair; and a first input transistor, having a body insulated from said substrate, connected in functional series with said first latch transistor, wherein a voltage of said body of said first latch transistor and a voltage of said body of said first input transistor are adjusted in conformity with an input of said dynamic logic circuit to improve switching of said sense amplifier, and wherein said input of said dynamic logic circuit is coupled to a gate of said first input transistor, and wherein a first channel connection of said first input transistor is coupled to a first channel connection of said first latch transistor.

2. The dynamic logic circuit of claim 1, wherein said first input transistor is coupled to said first latch transistor, and wherein a body of said first latch transistor and said body of said first input transistor are coupled to said input of said dynamic logic circuit, wherein a threshold voltage of said first latch transistor and a threshold voltage of said second latch transistor are adjusted in conformity with said input of said dynamic logic circuit, whereby improved switching of said sense amplifier is achieved.

3. The dynamic logic circuit of claim 1, further comprising a second input transistor having a gate coupled to a complementary input of said dynamic logic circuit, an isolated body coupled to said complementary input, and a first channel connection coupled to a second channel connection of said second latch transistor.

4. The dynamic logic circuit of claim 3, wherein said sense amplifier further comprises:

a third latch transistor of complementary type to said first latch transistor and having a gate coupled to said gate of said first latch transistor and a channel connection coupled to said second channel connection of said first latch transistor; and a fourth latch transistor of complementary type to said second latch transistor and having a gate coupled to said gate of said second latch transistor and a channel connection coupled to said first channel connection of said second latch transistor, whereby said first latch transistor, said second latch transistor, said third latch transistor and said fourth latch transistor form a complementary cross-coupled amplifier.

5. The dynamic logic circuit of claim 4, further comprising a pre-charge circuit coupled to a sense enable input of said dynamic logic circuit and further coupled to said second channel connection of said first latch transistor and said first channel connection of said second latch transistor, for pre-setting the state of said complementary cross-coupled amplifier when said sense enable input is inactive.

6. The dynamic logic circuit of claim 5, further comprising a foot transistor having a first channel connection coupled to a second channel connection of said first input transistor and further coupled to a second channel connection of said second input transistor, wherein said foot transistor has a gate coupled to said sense enable input and a second channel connection coupled to a power supply rail for permitting conduction of said first input transistor and said second input transistor only when said sense enable input is active.

7. The dynamic logic circuit of claim 6, wherein said dynamic logic circuit is fabricated in silicon-on-insulator technology.

8. The dynamic logic circuit of claim 1, wherein said dynamic logic circuit is fabricated in silicon-on-insulator technology.

9. A dynamic logic circuit fabricated on a substrate, said dynamic logic circuit comprising:

a first latch transistor having a body insulated from said substrate;

a second latch transistor having a gate coupled to a second channel connection of said first latch transistor, wherein said first latch transistor has a gate coupled to a first channel connection of said second latch transistor;

a third latch transistor of complementary type to said first latch transistor and having a gate coupled to said gate of said first latch transistor and a channel connection coupled to said second channel connection of said first latch transistor; and a fourth latch transistor of complementary type to said second latch transistor and having a gate coupled to said gate of said second latch transistor and a channel connection coupled to said first channel connection of said second latch transistor;

a first input transistor having a body insulated from said substrate, connected in functional series with said first latch transistor, wherein a voltage of said body of said first latch transistor and a voltage of said body of said first input transistor are adjusted in conformity with an input of said dynamic logic circuit to improve switching of said sense amplifier said first latch transistor, and wherein a body of said first latch transistor and said body of said first input transistor are coupled to an input of said dynamic logic circuit, wherein a threshold voltage of said first latch transistor and a threshold voltage of said second latch transistor are adjusted in conformity with said input of said dynamic logic circuit to improve switching of said cross-coupled amplifier.

10. The dynamic logic circuit of claim 9, further comprising:

a first pre-charge transistor having a gate coupled to a sense enable input of said dynamic logic circuit and a channel connection coupled to said second channel connection of said first latch transistor;

a second pre-charge transistor having a gate coupled to said sense enable input and a channel connection coupled to said first channel connection of said second latch transistor.

11. The dynamic logic circuit of claim 10, further comprising a shunt transistor having a gate coupled to a sense enable input of said dynamic logic circuit, a first channel connection coupled to said second channel connection of said first latch transistor, and a second channel connection coupled to said first channel connection of said second latch transistor.

12. The dynamic logic circuit of claim 11, further comprising a foot transistor having a first channel connection coupled to a second channel connection of said first input transistor and further coupled to a second channel connection of said second input transistor, wherein said foot transistor has a gate coupled to said sense enable input and a second channel connection coupled to a power supply rail for permitting conduction of said first input transistor and said second input transistor only when said sense enable input is active.

13. The dynamic logic circuit of claim 10, further comprising a foot transistor having a first channel connection coupled to a second channel connection of said first input transistor and further coupled to a second channel connection of said second input transistor, wherein said foot transistor has a gate coupled to said sense enable input and a second channel connection coupled to a power supply rail for permitting conduction of said first input transistor and said second input transistor only when said sense enable input is active.

14. The dynamic logic circuit of claim 9, wherein said dynamic logic circuit is fabricated in silicon-on-insulator technology.

* * * * *